US011592498B2

(12) United States Patent
Hawaz et al.

(10) Patent No.: US 11,592,498 B2
(45) Date of Patent: Feb. 28, 2023

(54) MULTI-PHASE FAULT IDENTIFICATION IN CAPACITOR BANKS

(71) Applicant: Schweitzer Engineering Laboratories, Inc., Pullman, WA (US)

(72) Inventors: Dereje Jada Hawaz, Norristown, PA (US); Satish Samineni, Malvern, PA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 0 days.

(21) Appl. No.: 17/489,253

(22) Filed: Sep. 29, 2021

(65) Prior Publication Data

US 2022/0107368 A1    Apr. 7, 2022

Related U.S. Application Data

(60) Provisional application No. 63/086,679, filed on Oct. 2, 2020.

(51) Int. Cl.
*G01R 31/64* (2020.01)
*G01R 31/40* (2020.01)
*H03K 19/20* (2006.01)

(52) U.S. Cl.
CPC .......... *G01R 31/64* (2020.01); *G01R 31/40* (2013.01); *H03K 19/20* (2013.01)

(58) Field of Classification Search
CPC ......... G01R 31/64; G01R 31/40; H03K 19/20
See application file for complete search history.

(56) References Cited

U.S. PATENT DOCUMENTS

| 3,477,024 A | 11/1969 | Pelta |
| 3,488,559 A | 1/1970 | Souillard |
| 3,585,298 A | 6/1971 | Liberman |
| 3,626,281 A | 12/1971 | Souillard |
| 3,670,240 A | 6/1972 | Maranchak |
| 3,859,564 A | 1/1975 | Zulaski |
| 3,878,460 A | 4/1975 | Nimmersjö |
| 3,890,544 A | 6/1975 | Chamia |

(Continued)

OTHER PUBLICATIONS

SEL-734B Capacitor Bank Control Field Reference Guide, Schweitzer Engineering Laboratories, Inc., Dec. 2018.

(Continued)

*Primary Examiner* — Farhana A Hoque
(74) *Attorney, Agent, or Firm* — Fletcher Yoder, P.C.; Richard M. Edge

(57) ABSTRACT

Systems, methods, and devices are provided for identifying multiple faults across multiple phases of a multi-phase and/or multi-section capacitor bank. A protection device may measure various voltages and currents within the capacitor bank. A phase angle of the measured voltages and currents may be used to determine a location of the faults therein. For example, a phase angle of a compensated unbalance voltage may be compared to a phase angle of a positive-sequence voltage of the capacitor bank. A logic controller may use a difference between the phase angle of the compensated unbalance voltage and the phase angle of the positive-sequence voltage to determine a location (e.g., a phase and/or a section of the capacitor bank) of the faults in the capacitor bank.

19 Claims, 13 Drawing Sheets

(56) References Cited

U.S. PATENT DOCUMENTS

| | | |
|---|---|---|
| 3,909,672 A | 9/1975 | Lundquist |
| 3,956,671 A | 5/1976 | Nimmersjö |
| 4,053,816 A | 10/1977 | Nimmersjö |
| 4,254,444 A | 3/1981 | Eriksson |
| 4,296,452 A | 10/1981 | Eriksson |
| 4,344,142 A | 8/1982 | Diehr |
| 4,351,011 A | 9/1982 | Liberman |
| 4,377,834 A | 3/1983 | Eriksson |
| 4,499,417 A | 2/1985 | Wright |
| 4,513,340 A | 4/1985 | Drain |
| 4,626,772 A | 12/1986 | Michel |
| 4,670,811 A | 6/1987 | Eda |
| 4,704,653 A | 11/1987 | Li |
| 4,766,549 A | 8/1988 | Schweitzer |
| 4,795,983 A | 1/1989 | Crockett |
| 4,797,805 A | 1/1989 | Nimmersjö |
| 4,800,509 A | 1/1989 | Nimmersjö |
| 5,140,492 A | 8/1992 | Schweitzer |
| 5,198,746 A | 3/1993 | Gyugyi |
| 5,208,545 A | 5/1993 | Schweitzer |
| 5,390,067 A | 2/1995 | Eriksson |
| 5,428,549 A | 6/1995 | Chen |
| 5,446,387 A | 8/1995 | Eriksson |
| 5,455,776 A | 10/1995 | Novosel |
| 5,515,227 A | 5/1996 | Roberts |
| 5,572,138 A | 11/1996 | Nimmersjö |
| 5,682,100 A | 10/1997 | Rossi |
| 5,729,144 A | 3/1998 | Cummins |
| 5,793,750 A | 8/1998 | Schweitzer |
| 5,796,258 A | 8/1998 | Yang |
| 6,008,971 A | 12/1999 | Duba |
| 6,256,592 B1 | 7/2001 | Roberts |
| 6,341,055 B1 | 1/2002 | Guzman-Casillas |
| 6,417,791 B1 | 7/2002 | Benmouyal |
| 6,477,475 B1 | 11/2002 | Takaoka |
| 6,496,342 B1 | 12/2002 | Horvath |
| 6,518,767 B1 | 2/2003 | Roberts |
| 6,525,543 B1 | 2/2003 | Roberts |
| 6,590,397 B2 | 7/2003 | Roberts |
| 6,597,180 B1 | 7/2003 | Takaoka |
| 6,608,742 B2 | 8/2003 | Schweitzer |
| 6,650,969 B1 | 11/2003 | Sieleman |
| 6,697,240 B2 | 2/2004 | Nelson |
| 6,721,671 B2 | 4/2004 | Roberts |
| 6,738,719 B2 | 5/2004 | Stoupis |
| 6,760,670 B2 | 7/2004 | Stoupis |
| 6,785,105 B2 | 8/2004 | Roberts |
| 6,798,211 B1 | 9/2004 | Rockwell |
| 6,839,210 B2 | 1/2005 | Roberts |
| 6,904,549 B2 | 6/2005 | Jurisch |
| 6,919,717 B2 | 7/2005 | Ghassemi |
| 6,934,654 B2 | 8/2005 | Benmouyal |
| 7,174,261 B2 | 2/2007 | Gunn |
| 7,345,488 B2 | 3/2008 | Fischer |
| 7,355,412 B1 | 4/2008 | Cannon |
| 7,400,150 B2 | 7/2008 | Cannon |
| 7,425,778 B2 | 9/2008 | Labuschagne |
| 7,535,233 B2 | 5/2009 | Kojovic |
| 7,616,005 B2 | 11/2009 | Kalyuzhny |
| 7,660,088 B2 | 2/2010 | Mooney |
| 7,714,735 B2 | 5/2010 | Rockwell |
| 7,733,094 B2 | 6/2010 | Bright |
| 8,081,002 B2 | 12/2011 | Wahlroos |
| 8,183,871 B2 | 5/2012 | Saha |
| 8,315,827 B2 | 11/2012 | Faybisovich |
| 8,525,522 B2 | 9/2013 | Gong |
| 8,558,551 B2 | 10/2013 | Mynam |
| 8,575,941 B2 | 11/2013 | Samineni |
| 8,598,887 B2 | 12/2013 | Bjorklund |
| 8,655,609 B2 | 2/2014 | Schweitzer |
| 8,781,766 B2 | 7/2014 | Schweitzer |
| 8,791,704 B2 | 7/2014 | Mynam |
| 8,990,036 B1 | 3/2015 | Schweitzer |
| 9,470,748 B2 | 10/2016 | Schweitzer |
| 9,594,112 B2 | 3/2017 | Schweitzer |
| 9,627,881 B2 | 4/2017 | Schweitzer |
| 10,122,162 B2 | 11/2018 | Yalla |
| 2001/0012984 A1 | 8/2001 | Adamiak |
| 2002/0165462 A1 | 11/2002 | Westbrook |
| 2004/0021995 A1 | 2/2004 | Roberts |
| 2004/0189317 A1 | 9/2004 | Borchert |
| 2004/0230387 A1 | 11/2004 | Bechhoefer |
| 2005/0151659 A1 | 7/2005 | Donovan |
| 2005/0243491 A1 | 11/2005 | Tanis |
| 2005/0275397 A1 | 12/2005 | Lightbody |
| 2006/0012374 A1 | 1/2006 | Kojovic |
| 2008/0007230 A1 | 1/2008 | Kalyuzhny |
| 2008/0077336 A1 | 3/2008 | Fernandes |
| 2008/0109205 A1 | 5/2008 | Nasle |
| 2008/0291593 A1 | 11/2008 | Day |
| 2008/0291708 A1 | 11/2008 | Teichmann |
| 2009/0073726 A1 | 3/2009 | Babcock |
| 2009/0230974 A1 | 9/2009 | Kojovic |
| 2011/0057661 A1 | 3/2011 | Samineni |
| 2011/0058285 A1 | 3/2011 | Wibben |
| 2011/0173496 A1 | 7/2011 | Hosek |
| 2011/0264388 A1 | 10/2011 | Gong |
| 2012/0086459 A1 | 4/2012 | Kim |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0241622 A1 | 9/2013 | Zerbe |
| 2014/0074414 A1 | 3/2014 | Schweitzer, III |
| 2015/0188306 A1* | 7/2015 | Yalla .................. H02H 7/16 361/15 |
| 2016/0077149 A1 | 3/2016 | Schweitzer |
| 2016/0077150 A1 | 3/2016 | Schweitzer |
| 2016/0084893 A1 | 3/2016 | Schweitzer |
| 2017/0012424 A1 | 1/2017 | Schweitzer |
| 2017/0082675 A1 | 3/2017 | Schweitzer |
| 2017/0146613 A1 | 5/2017 | Schweitzer |
| 2017/0356965 A1 | 12/2017 | Guzman-Casillas |
| 2022/0299579 A1 | 9/2022 | Hao |

OTHER PUBLICATIONS

Dhillon, Malkiat S., Demetrios A. Tziouvaras, Protection of Fuseless Capacitor Banks Using Digital Relays, http://www.selinc.com/techpprs/fuseless_capacitors.pfd, Oct. 11, 1999.

Schweitzer, III, Edmund O., Jolene Schafman, Unified Shunt Capacitor Bank Control and Protection, http://www.selinc.com/techpprs/6055.pdf, May 1, 1991.

Brunello, Gustavo, Bogdan Kasztenny, Craig Wester, Shunt Capacitor Bank Fundamentals and Protection, 2003 Conference for Protective Relay Engineers—Texas A&M University, College Station, TX, Apr. 3, 2003.

Fleming, Bill, Negative-Sequence Impedance Directional Element, https://www.selinc.com/WorkArea/DownloadAsset.aspx?id=2475, Jun. 20, 2005.

Calero, Fernando, Rebirth of Negative-Sequence Quantities in Protective Relaying With Microprocessor-Based Relays, https://www.selinc.com/WorkArea/DownloadAsset.aspx?id=2805, Jun. 25, 2005.

\* cited by examiner

MULTI-PHASE FAULT IDENTIFICATION IN CAPACITOR BANKS

CROSS-REFERENCE TO RELATED APPLICATIONS

This application claims the benefit of U.S. Provisional Application No. 63/086,679, filed Oct. 2, 2020, and entitled "Multi-Phase Fault Identification in Capacitor Banks," which is incorporated herein by reference in its entirety for all purposes.

BACKGROUND

This disclosure relates to protection of a capacitor bank in an electric power delivery system. More particularly, this disclosure relates to identifying a multi-phase fault in a capacitor bank of a multiple-phase electric power delivery system.

Capacitor banks are critical substation assets that play a vital role in providing reactive power support, thereby increasing capacity of the electric power system. High-voltage capacitor banks may be constructed using various configurations, such as single-wye, double-wye, or H bridge. Capacitor banks may be grounded or ungrounded. Capacitor banks may include several single-phase capacitors connected in series and/or parallel to achieve the desired voltage and volt-amperes reactive (VAR) rating. The capacitors may be fused, externally or internally, may be fuseless, or may be unfused. If an unbalance of a capacitor bank resulting from failures of individual capacitors becomes too high, the capacitor bank may need to be taken out of service by the protection system before an overvoltage leads to a cascading failure of the remaining capacitors in the capacitor bank. In that case, the faulty (e.g., failed) capacitors may need to be replaced.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION

Figure 1:
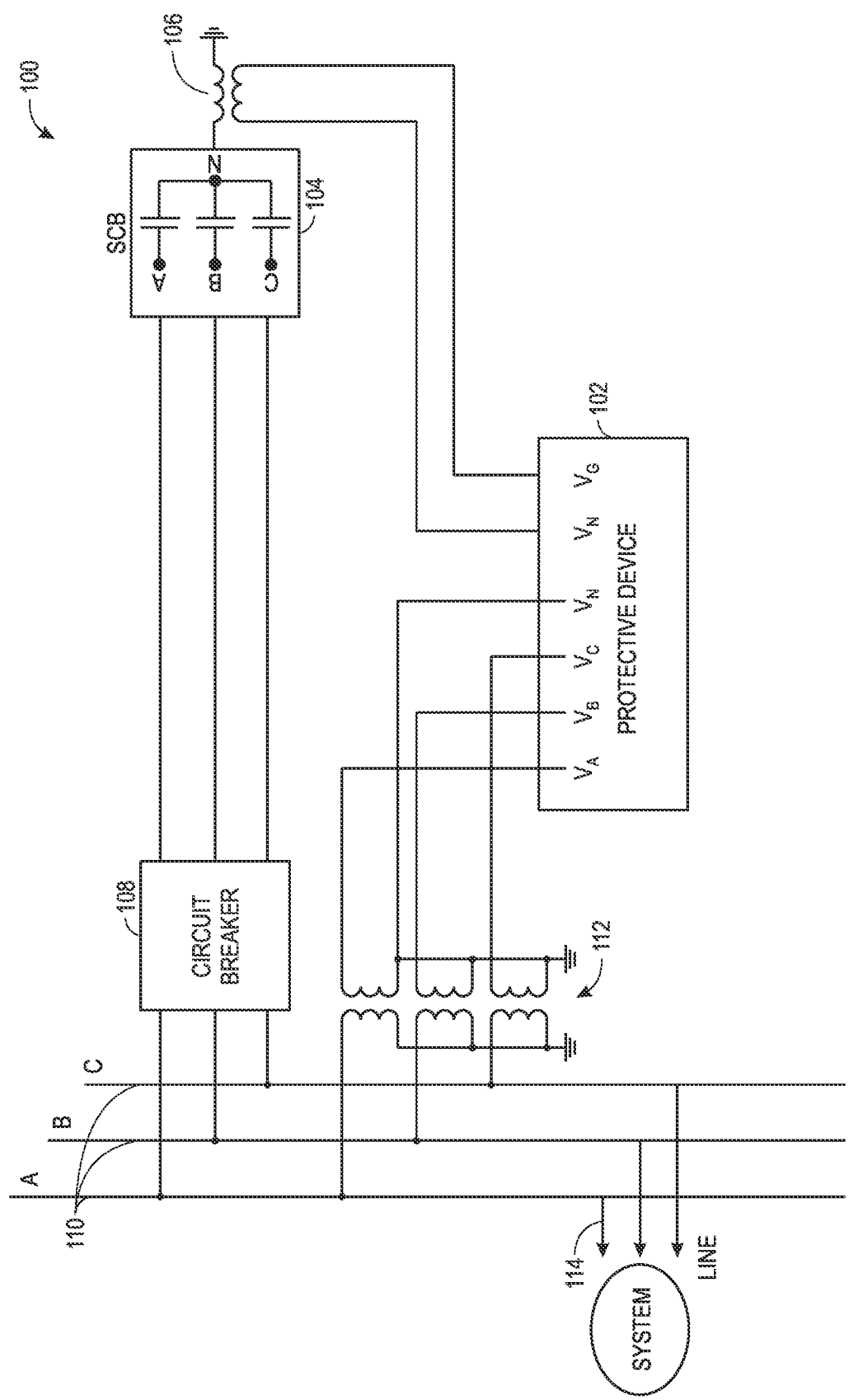
FIG. 1 is a simplified block diagram of a system for determining a location of a multi-phase fault in a single capacitor bank in a WYE configuration, in accordance with an embodiment of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

As discussed above, if a capacitor bank is externally fused, a fault location typically corresponds to a blown fuse that can be physically and/or visually located. That is, an operator can easily locate the fault by examining the capacitor bank. If the capacitor bank is internally fused, fuseless, or unfused, a location of the fault may be difficult to determine because of a lack of physical and/or visual indication of the problem. In that case, a time-consuming physical and/or visual inspection may be needed. However, a prolonged inspection may result in an extended outage of the capacitor bank. In some cases, it may not be possible to locate the faulty unit in an internally fused, fuseless, or unfused bank. However, locating the faulted phase and section may narrow the search area and reduce the outage time.

If the capacitor bank is multi-phase, an inspection to locate the fault may be even more time consuming due to the increased number of capacitor and/or fault locations. Embodiments presented herein provide techniques to determine a fault location or an area of a multi-phase capacitor bank in which a fault has occurred. In some embodiments, a phase angle of an unbalanced capacitor bank may be compared with a reference phase angle. The phase angle of the unbalanced capacitor bank is a phasor with a magnitude indicating a measure of the unbalance of the capacitor bank.

The fault location techniques presented herein may be used to locate faulty capacitors and/or faulty capacitor units in multiple phases of a capacitor bank. That is, the techniques presented herein may be used to locate multiple faults within multiple capacitor banks or portions of a capacitor bank across multiple phases. Advantageously, techniques presented herein may substantially reduce an inspection time to locate faults in a multi-phase capacitor bank by at least narrowing an area of the capacitor bank to be inspected. Further, techniques presented herein may substantially reduce an occurrence and/or length of downtime of the capacitor bank due to a fault and replacement of associated components FIG. 1 is a simplified block diagram of a system 100 for determining a location of a multi-phase fault in a single capacitor bank 104 in a WYE configuration, in accordance with an embodiment of the present disclosure. As an example, the capacitor bank 104 is an ungrounded shunt capacitor bank having a plurality of capacitor units connected in a WYE arrangement. The capacitor bank 104 is operatively coupled to a busbar 110 via a circuit breaker 108. As shown, the system 100 includes a busbar 110 for each phase (e.g., A-phase, B-phase, and C-phase). Each busbar 110 may be coupled to a line 114 to provide power to other components (not shown) of an electric power delivery system.

A protective device 102 is operatively coupled to the busbar 110 via a number of transformer groups 112. The protective device 102 is also operatively coupled to a neutral point (N) of the capacitor bank 104 via a transformer 106, enabling the protective device 102 to monitor a neutral-to-ground voltage of the capacitor bank 104. In operation, the protective device 102 may monitor various phases of primary sinusoidal voltage signals (e.g., A-phase, B-phase, and C-phase). In a balanced power system, each phase (A, B, and C) may be shifted from the other phases by 120 degrees. That is, under balance conditions, the three phases have phase angles of $\angle 0°$, $\angle -120°$, and $\angle 120°$, respectively (assuming the phase rotation is A-B-C).

The protective device 102 may determine whether a fault exists in the shunt capacitor bank 104 by using a neutral voltage unbalance protection method, discussed herein. To do so, the protective device 102 may measure a neutral point voltage (VNG) as the neutral to ground and a zero-sequence voltage (V0G) at the busbar 110. The neutral point voltage (VNG) may represent a system voltage unbalance and an inherent unbalance in the capacitor bank 104. In some embodiments, the neutral point voltage (VNG) may correspond to an unbalance voltage (DVG). The zero-sequence voltage (V0G) may represent the system voltage unbalance. The protective device 102 may also measure a positive-sequence voltage (V1G) at the busbar 110. The positive-sequence voltage (V1G) may be used as a reference voltage. The positive, negative, and/or zero sequence voltages and/or currents may be obtained by applying a transformation on the A-phase, B-phase, and C-phase voltage and/or current measurements.

To calculate the inherent unbalance in the capacitor bank 104, the protective device 102 may use the zero-sequence voltage (V0G) from the busbar 110 and neutral point voltage (assuming transforming ratios are the same, otherwise the zero-sequence voltage is normalized). By accounting for this inherent unbalance in the capacitor bank 104, a fault in the capacitor bank 104 may result in a compensated neutral voltage (VNG). That is, under normal conditions, the compensated neutral voltage (VNG) has a magnitude of zero. If a fault occurs in the capacitor bank 104, the compensated neutral voltage (VNG) will have a magnitude other than zero. In that case, the protective device 102 may use the phase angle of the compensated neutral voltage ($\angle$VNG) and the phase angle of the positive-sequence voltage ($\angle$V1G) to determine which phase(s) is faulted. In some embodiments, the protective device 102 may determine a reference phase angle from an associated voltage signal and/or current signal, or any transformation thereof including alpha-beta-gamma or d-q-0 or symmetrical components or any mathematical derivatives of those, such as sum, difference, product, scaling, etc. of the voltage signal and/or current signal.

Figure 2:
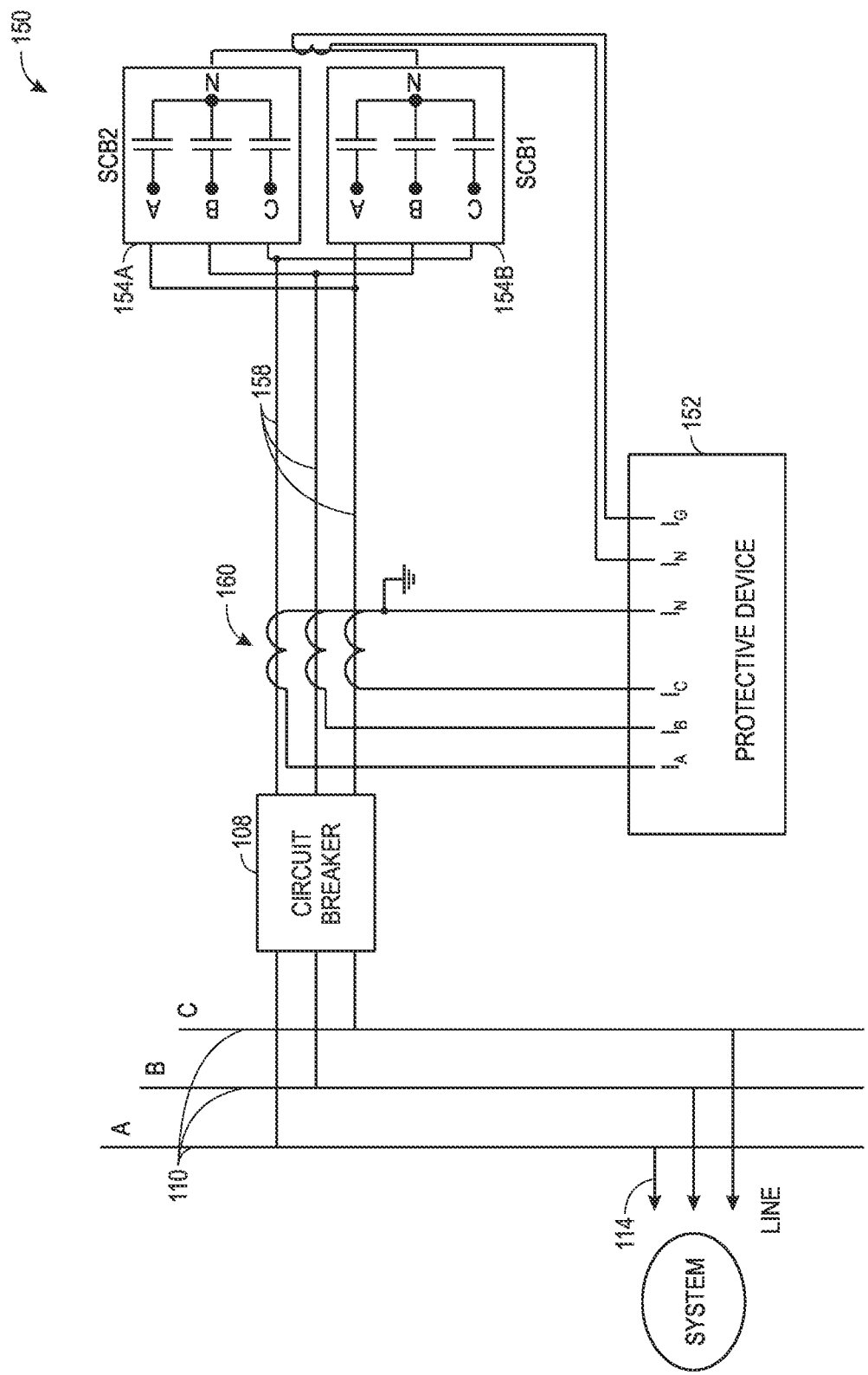
FIG. 2 is a simplified block diagram of a system for determining a location of a phase fault in a pair of capacitor banks connected in a double WYE configuration, in accordance with an embodiment of the present disclosure.

In some embodiments, the capacitor bank 104 may include multiple portions. That is, the system 100 may include multiple capacitor banks 104, as shown in FIG. 2. FIG. 2 is a simplified block diagram of a system 150 for determining a location of a multi-phase fault in a pair of capacitor banks 154A, 154B in a double WYE configuration, in accordance with an embodiment of the present disclosure. The capacitor banks 154A, 154B may be ungrounded shunt capacitor bank portions. As shown, the system 150 includes a protective device 152. The protective device 152 may correspond to the protective device 102 discussed with respect to FIG. 1. The capacitor banks 154A, 154B are operatively coupled to the protective device 152 is coupled to the capacitor banks 154A, 154B and operatively coupled to the busbar 110 via lines 158 and the circuit breaker 108. The protective device 102 is operatively coupled to a number of transformer groups 160 to monitor primary sinusoidal current signals (e.g., bus currents) for each phase (e.g., A-phase, B-phase, and C-phase). The protective device 102 is also operatively coupled to the neutral point of the capacitor bank portions 154A, 154B via a transformer 156 to monitor a neutral current of the capacitor bank portions 154A, 154B.

The protective device 152 may determine one or more faulted phases in capacitor bank portions 502A, 502B. To do so, the protective device 102 may measure and use a neutral current (IN) and bus currents (IA, IB, and IC) to determine a bank unbalance current (e.g., 60KN). In some cases, the bank unbalance current (e.g., 60KN) may be determined by subtracting a sum of the zero-sequence bus currents (e.g., $3I_0$, for each phase A, B, and C) from the neutral current IN. For an ungrounded bus, a sum of the bus currents (e.g., $3I_0$) is zero (e.g., 0):

$$IA+IB+IC=0 \quad \text{(Equation 1)}$$

Solving for IA provides:

$$IA=-(IB+IC) \quad \text{(Equation 2)}$$

After compensating for inherent unbalances in the capacitors, the neutral current may be provided by:

$$IN=K1*IB+K2*IC \quad \text{(Equation 3)}$$

where K1 and K2 are scalar quantities that are zero (e.g., 0) if the capacitor bank 154A, 154B is completely balanced. In some cases, the scalar quantities K1 and K2 may be based on relay measurements and may reset the unbalance current of (e.g., 60KN). In some cases, the scalar quantities K1 and K2 may be phasor quantities that are used as compensation factors for the compensated unbalance current.

The protective device 152 may use a magnitude of the bank unbalance current to provide over voltage protection to the capacitor units of the capacitor bank portions 502A, 502B. A location of faults in multiple phases may be identified based on the neutral current, bus currents, and a phase angle of the unbalance current ($\angle 60KNA$). This is discussed in more detail with respect to FIGS. 9-14 below.

Figure 3:
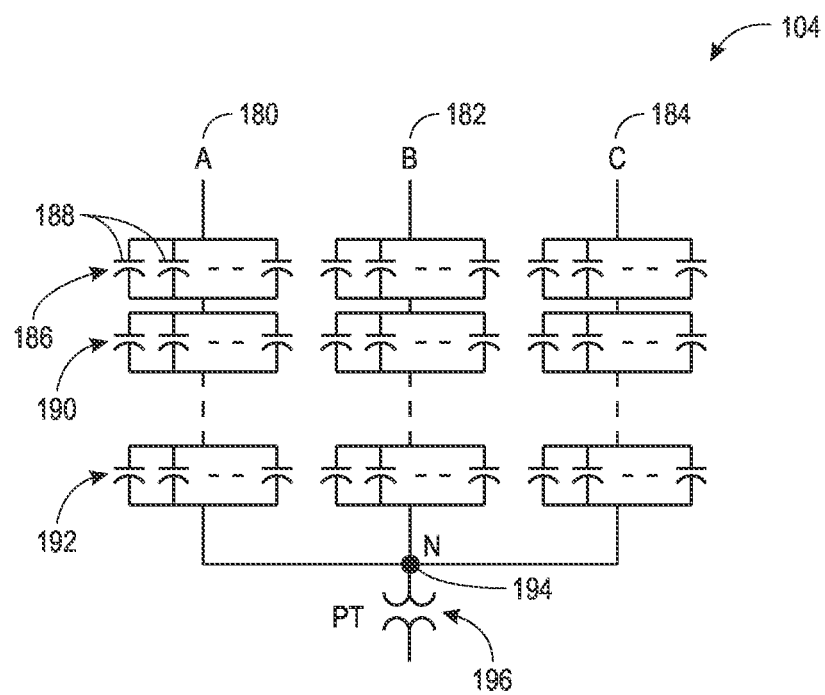
FIG. 3 is a schematic diagram of an ungrounded single WYE capacitor bank.

FIG. 3 is a schematic diagram of an ungrounded single WYE capacitor bank 104. The capacitor bank 104 of FIG. 3 may correspond to the capacitor bank 104 discussed with respect to FIG. 1 above. While one capacitor bank 104 is shown, it should be understood that the techniques presented herein may be used to identify and locate faults in any number of capacitor banks.

The capacitor bank 104 includes a number of capacitor units 186, 190, 192 for each phase (e.g., phase A 108, phase B 182, and phase C 184). Each capacitor unit 186, 190, 192 includes a number of capacitors 188 coupled in parallel. The capacitor units 186, 190, 192 for each phase are coupled in series. The capacitor units 186, 190, 192 for each phase are parallel to the capacitor units 186, 190, 192 for the other phases. For example, the capacitor units 186, 190, 192 for phase A 180 are parallel to the capacitor units 186, 190, 192 for phase B 182 and phase C 184. A power transformer 196 is coupled to the capacitor bank 104 and measures a neutral voltage (N) between a node 194 and ground.

Figure 4:
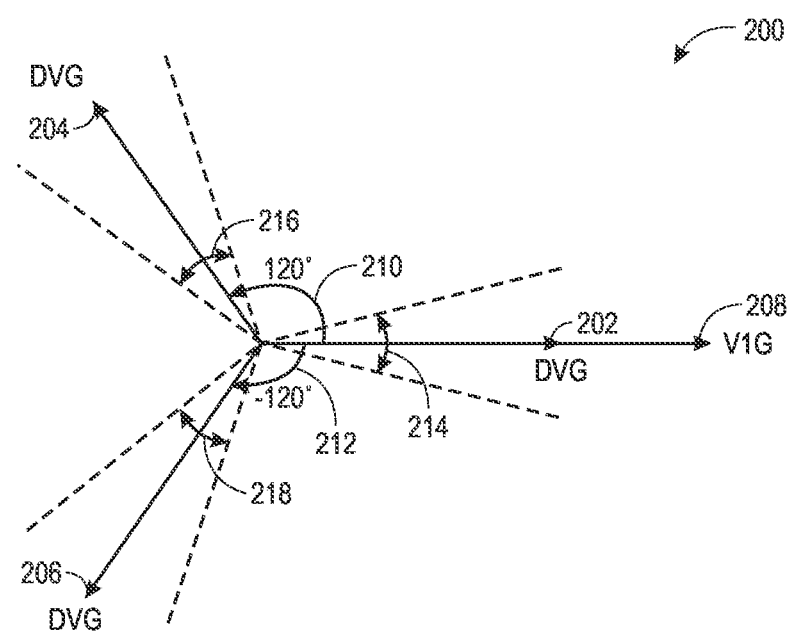
FIG. 4 is a vector representation for multi-phase faults of a single WYE capacitor bank, accordance with an embodiment of the present disclosure.

FIG. 4 is a vector representation 200 for multi-phase faults of a single WYE capacitor bank, in accordance with an embodiment of the present disclosure. The vector representation 200 may correspond to phase angles of various measured voltages of the system 100 discussed with respect to FIG. 1. The vector representation 200 is a phasor diagram and may be used to compare a phase angle of a compensated unbalance voltage (DVG) 202 with a phase angle of a positive-sequence voltage (V1G) 208. As discussed above, the compensated unbalance voltage (DVG) 202 may correspond to the compensated neutral voltage and may have a magnitude (and phase angle) of zero when no fault is present in the capacitor bank 104. For example, the difference between the neutral point voltage (VNG) and the zero-sequence voltage (e.g., $3V_0$) may be used to determine the unbalance (i.e., difference) voltage (DVG). Thus, when a fault is present in the capacitor bank 104, the compensated unbalance voltage 202 may have a non-zero magnitude. In that case, a phase angle of the compensated unbalance voltage 202 may be compared to a phase angle of the positive-sequence voltage 208 to determine a location of the fault(s) in the capacitor bank 104.

For a given combination of faults in the phases of the capacitor bank 104, the phase angle of the compensated unbalance voltage 202 may change. That is, the phase angle of the compensated unbalance voltage 202 may increase or decrease for a given fault (or combination of faults) in the capacitor bank 104. To determine a location of the fault or combination of faults in the capacitor bank 104, the phase angle of the compensated unbalance voltage 202 may be compared to the phase angle of the positive-sequence voltage 208.

If the phase angle of the compensated unbalance voltage 202 is in-phase with the positive-sequence voltage 208, as illustrated by the phasor corresponding to the compensated unbalance voltage 202, the faults may be in phase B 182 and phase C 184 of the capacitor bank 104. If the phase angle of the compensated unbalance voltage 202 is +120 degrees (210) out of phase with the positive-sequence voltage 208, as illustrated by the phasor 204, the faults may be in phase A 180 and phase B 182 of the capacitor bank 104. If the phase angle of the compensated unbalance voltage 202 is −120 degrees (212) out of phase with the positive-sequence voltage 208, as illustrated by the phasor 206, the faults may be in phase A 180 and phase C 184 of the capacitor bank 104.

In some embodiments, a phase angle of the compensated unbalance voltage 202 within about ±15 degrees of the phasors discussed above may be considered to have a phase angle of the closest phasor 202, 204, 206. That is, the phase angle of each combination of faults may fall within a range. The 15 degree ranges may compensate for unbalances in the capacitor bank that are not due to capacitor failures. For example, a phase angle of the compensated unbalance voltage 202 in a range 214 of between +15 degrees and −45 degrees may be considered to be in-phase with the positive-sequence voltage 208. Similarly, a phase angle of the compensated unbalance voltage 202 in a range 216 between +105 degrees and +135 degrees may be considered to be +120 degrees out of phase with the positive-sequence voltage 208. Moreover, a phase angle of the compensated unbalance voltage 202 in a range 218 between 435 degrees and +135 degrees may be considered to be +120 degrees out of phase with the positive-sequence voltage 208.

Advantageously, using the phase angle of the compensated unbalance voltage 202, 204, 206 relative to the phase angle of the positive-sequence voltage 208 (or a difference between the phase angle of the compensated unbalance voltage 202, 204, 206 and the phase angle of the positive-sequence voltage 208) enables determining a location of multiple faults in multiple phases of a multi-phase capacitor bank. In this way, techniques presented herein enable determining a fault location relatively quickly and substantially reduce an inspection time to locate the actual fault (e.g., a faulty capacitor and or faulty capacitor unit).

Figure 5:
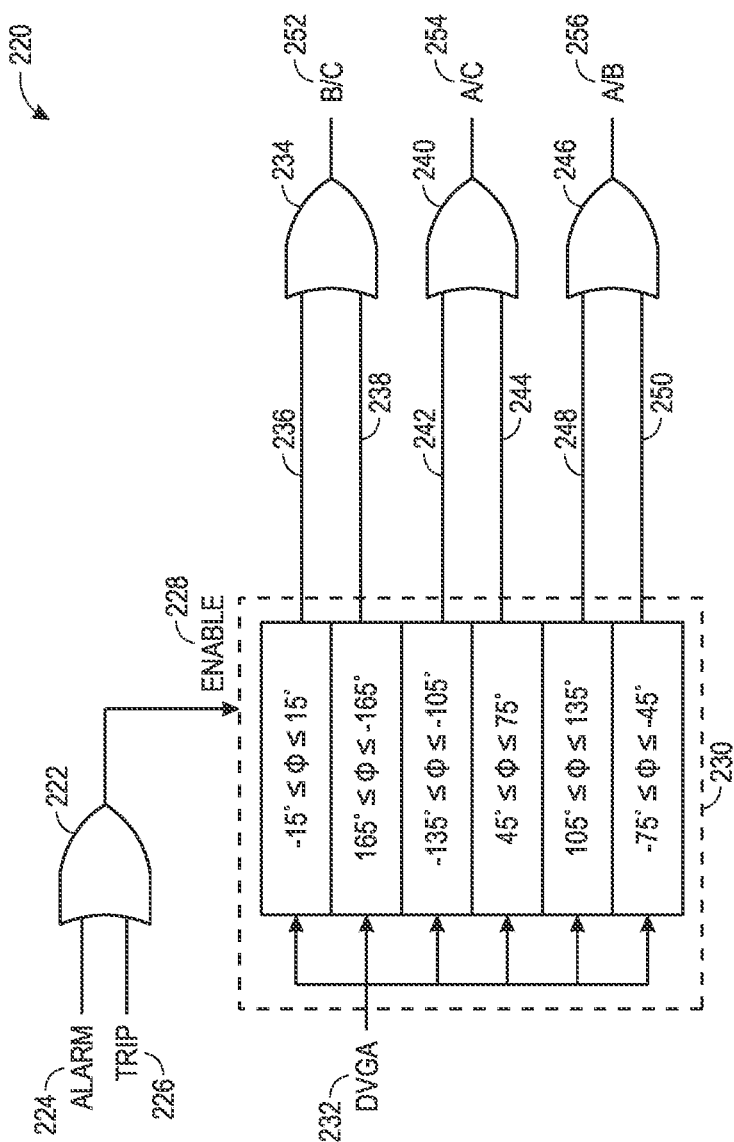
FIG. 5 is a logic diagram for determining a location of faults in an ungrounded multi-phase single WYE capacitor bank, in accordance with an embodiment of the present disclosure.

FIG. 5 is a logic diagram illustrating logic 220 used to determine a location of a faults in an ungrounded multi-phase single WYE capacitor bank, in accordance with an embodiment of the present disclosure. In e embodiments, the logic 220 may be part of the protective device 102 discussed with respect to FIG. 1. In other embodiments, the logic 220 may be separate from the protective device 102 and may receive voltages and/or voltage phase angles measured by the protective device 102.

As shown, the logic 220 includes a logic controller 230. The logic controller 230 may receive an ENABLE signal 228 indicating that an ALARM signal 224 or a TRIP signal 226 has occurred. The ALARM signal 224 and the TRIP signal 226 may indicate an issue within a corresponding capacitor bank, such as the capacitor banks 104, 154A, 154B, discussed with respect to FIGS. 1-3. For example, the ALARM signal 224 or the TRIP signal 6 may indicate an overvoltage caused by, for example, a short circuit in the capacitor bank, a blown fuse, an over temperature of one or more capacitors in the capacitor bank, and the like.

In some embodiments, the ALARM signal 224 and the TRIP signal 226 may be received by a logic OR gate 222. Based on the values of the ALARM signal 224 and the TRIP signal 226, the logic OR gate 222 may provide the ENABLE signal 228 as a logic high (e.g., 1) to the logic controller 230. That is, if an issue in the capacitor bank is indicated by either the ALARM signal 224 or the TRIP signal 226 being a logic high (e.g., 1), the ENABLE signal 228 may be a logic high and enable the logic controller 230 to evaluate a phase angle 232 of the compensated unbalance voltage of the capacitor bank.

The logic 220 may identify one or more phase angle ranges corresponding to multi-phase faults within the capacitor bank. For example, as shown, the logic 220 may identify the phase angle ranges of zero degrees±15 degrees (e.g. from +15 degrees to −15 degrees), +180 degrees±15 degrees (e.g., from +165 degrees to −165 degrees), −120 degrees±15 degrees (e.g., from −135 degrees to −105 degrees), +60 degrees±15 degrees (e.g., from +45 degrees to +75 degrees), +120 degrees±15 degrees (e.g., from +105 degrees to +135 degrees), and −60 degrees±15 degrees (e.g., from −75 degrees to −45 degrees), inclusive. The logic controller 230 may receive the phase angle 232 of the compensated unbalance voltage from the protective device 102 and determine a phase angle range within which the phase angle 232 falls. The logic controller 230 may output a logic high value (e.g., 1) on a corresponding line 236, 238, 242, 244, 248, 250 based on a phase angle range corresponding to the phase angle 232.

The logic 220 may output an indication of a location of the multi-phase faults via corresponding logic OR gates 234, 240, 246 based on the logic high value output by the logic controller 230. As shown, a logic high value output by the logic controller 230 on the lines 236 or 238 may cause a logic high output from the logic OR gate 234, indicating a fault in phases B and C of the capacitor bank. A logic high value output by the logic controller 230 on the lines 242 or 244 may cause a logic high output from the logic OR gate 240, indicating a fault in phases A and C of the capacitor bank. A logic high value output by the logic controller 230 on the lines 248 or 250 may cause a logic high output from the logic OR gate 246, indicating a fault in phases A and B of the capacitor bank.

As an example, if the phase angle 232 falls within the range from −135 degrees to −105 degrees, the logic controller 230 may output a logic high value (e.g., 1) on the corresponding line 242. In that case, the output 254 of the logic OR gate 240 may be a logic high, indicating a fault in phases A and C of the capacitor bank. That is, the output 254 of the logic OR gate 240 is the output of the logic 220 and may be used to identify the location of the faults in the capacitor bank.

Advantageously, the logic 220 may be used to quickly analyze the phase angle 232 of the compensated unbalance voltage of the capacitor bank and identify a location of the hi-phase faults therein. In this way, the logic 220 may substantially reduce a downtime needed to inspect the capacitor bank and locate the faults. In some embodiments, the output 252, 254, 256 of the logic 220 may be used to enable an alarm or notification indicating that an issue has occurred within the corresponding capacitor bank and the phases in which the issues are located. An operator may use the alert or notification to quickly resolve the issue and resume operation of the capacitor bank.

Figure 6:
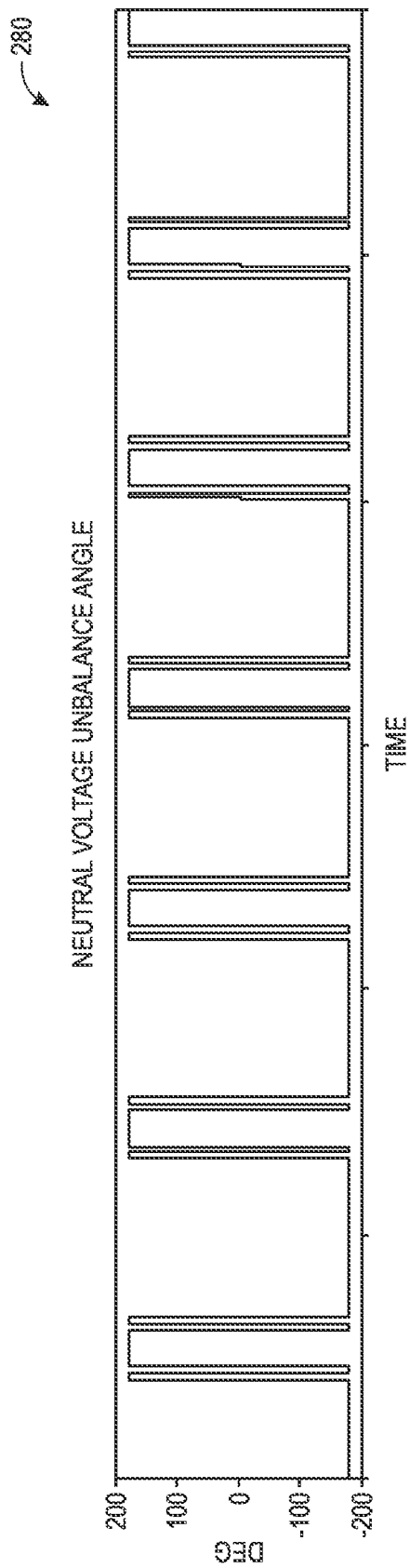
FIG. 6 is a graph illustrating a voltage phase angle of a fuseless single WYE capacitor bank with a fault in phases B and C, in accordance with an embodiment of the present disclosure.

FIG. 6 is a graph 280 illustrating a voltage phase angle of a fuseless single WYE capacitor bank with a fault in phases B 182 and C 184, in accordance with an embodiment of the present disclosure. The voltage phase angle in the graph 280 corresponds to a phase angle of a compensated unbalance voltage of a capacitor bank (or a difference between the phase angle of the compensated unbalance voltage and the phase angle of the neutral point voltage of the capacitor bank), as discussed above. As shown, the voltage phase angle in the graph 280 is between about +180 degrees and −180 degrees, ±15 degrees. Thus, the voltage phase angle is within the phase angle range of +/−180 degrees±15 degrees (e.g., from +165 degrees to −165 degrees), indicating faulted capacitors and/or capacitor units in phases B 182 and C 184 (e.g., the output 252 of FIG. 5) of the capacitor bank.

Figure 7:
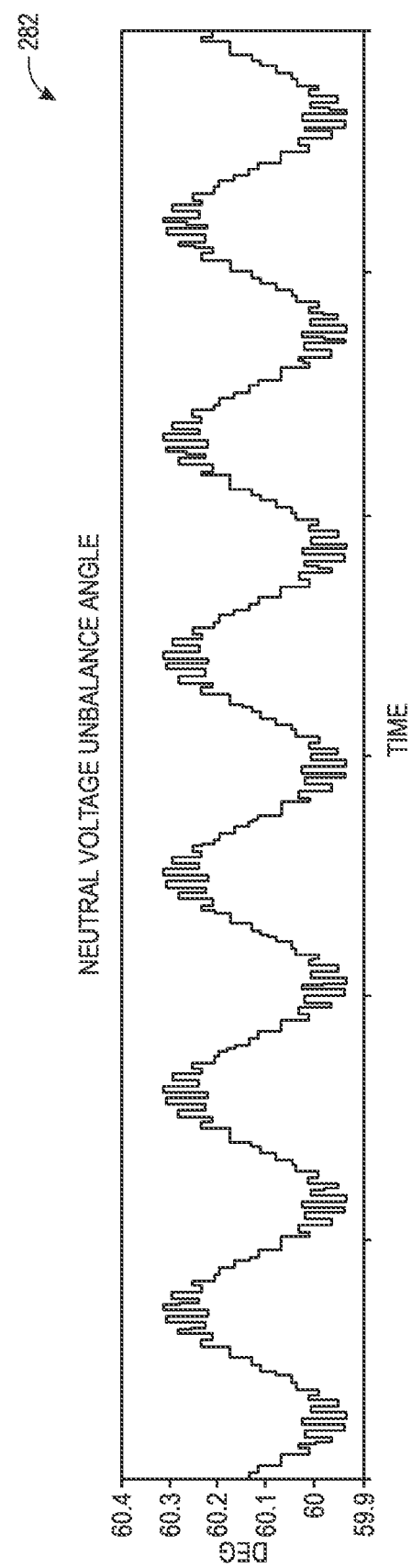
FIG. 7 is a graph illustrating a voltage phase angle of a fuseless single WYE capacitor bank with a fault in phases A and C, in accordance with an embodiment of the present disclosure.

FIG. 7 is a graph 282 illustrating a voltage phase angle of a fuseless single WYE capacitor bank with a fault in phases A 180 and C 184, in accordance with an embodiment of the present disclosure. As above, the voltage phase angle in the graph 282 corresponds to a phase angle of the compensated unbalance voltage of a capacitor bank (or a difference between the phase angle of the compensated unbalance voltage and the phase angle of the neutral point voltage of the capacitor bank). As shown, the voltage phase angle in the graph 282 is between about +60.3 degrees and 59.9 degrees, ±15 degrees. Thus, the voltage phase angle is within the phase angle range of +60 degrees±15 degrees (e.g., from +45 degrees to +75 degrees), indicating faulted capacitors and/or capacitor units in phases A 180 and C 184 (e.g., the output 254 of FIG. 5) of the capacitor bank.

Figure 8:
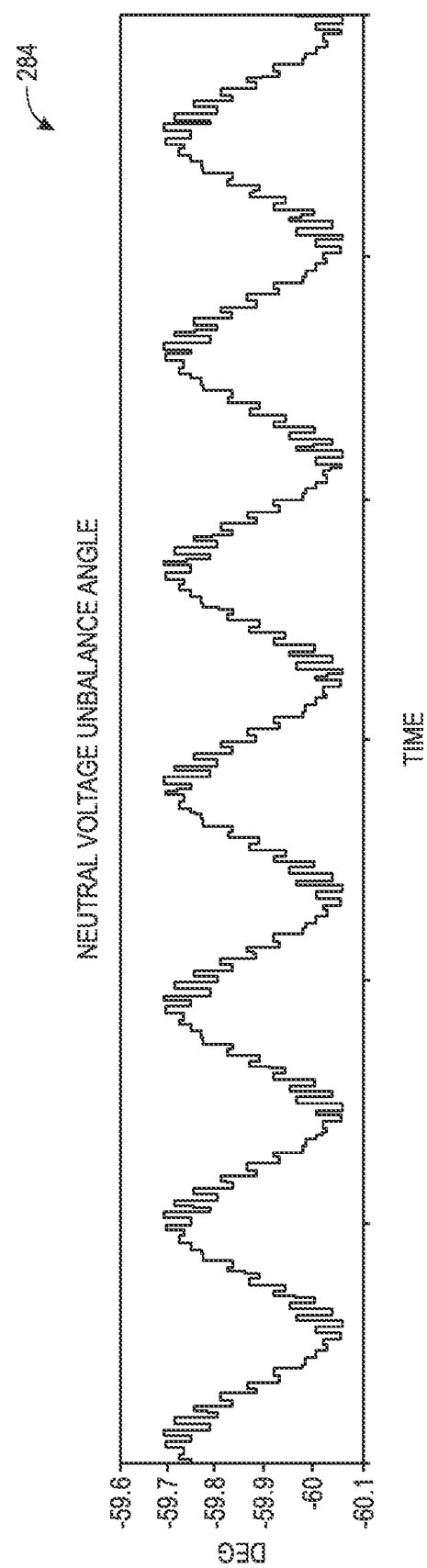
FIG. 8 is a graph illustrating a voltage phase angle of a fuseless single WYE capacitor bank with a fault in phases A and B, in accordance with an embodiment of the present disclosure.

FIG. 8 is a graph 284 illustrating a voltage phase angle of a fuseless single WYE capacitor bank with a fault in phases A 180 and B 182, in accordance with an embodiment of the present disclosure. As above, the voltage phase angle in the graph 284 corresponds to a phase angle of the compensated unbalance voltage of a capacitor bank (or a difference between the phase angle of the compensated unbalance voltage and the phase angle of the neutral point voltage of the capacitor bank). As shown, the voltage phase angle in the graph 284 is between about −59.7 degrees and −60 degrees, ±15 degrees. Thus, the voltage phase angle is within the phase angle range of −60 degrees±15 degrees (e.g., from −75 degrees to −45 degrees), indicating faulted capacitors and/or capacitor units in phases A 180 and B 182 (e.g., the output 256 of FIG. 5) of the capacitor bank.

Figure 9:
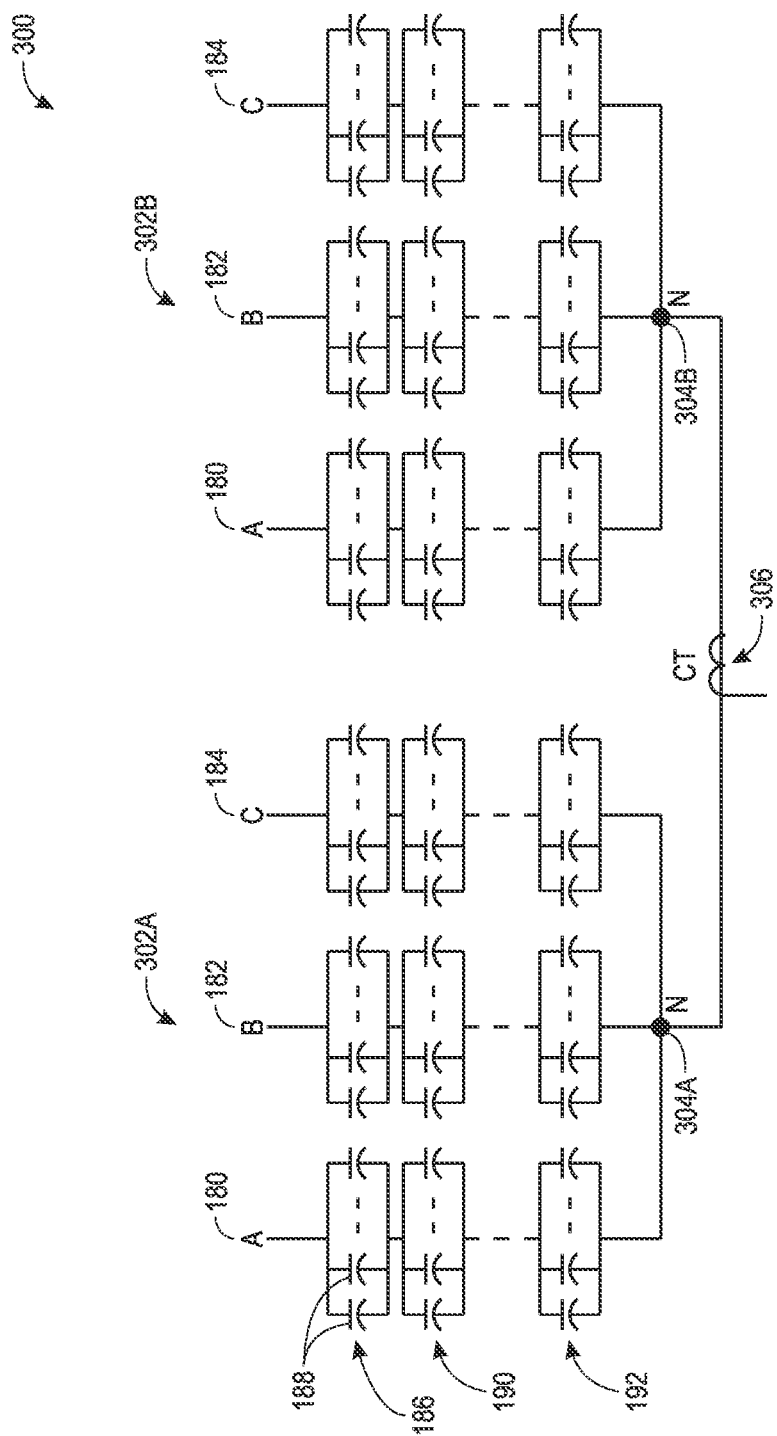
FIG. 9 is a simplified block diagram of an ungrounded double WYE capacitor bank, in accordance with an embodiment of the present disclosure.

FIG. 9 is a simplified block diagram of an ungrounded double WYE capacitor bank 300, in accordance with an embodiment of the present disclosure. As shown, the capacitor bank 300 includes separate capacitor banks and/or sections 302A, 302B. The capacitor bank sections 302A, 302B may correspond to the capacitor banks 154A, 154B, respectively, discussed with respect to FIG. 2. In some cases, the capacitor banks may be referred to as a left section or left capacitor bank 302A and a right section or right capacitor bank 302B. That is, the double WYE capacitor bank 300 may have a substantially increased number of capacitors 188 and capacitor units 186, 190, 192 compared to the capacitor bank 104 discussed with respect to FIG. 3.

Advantageously, embodiments presented herein enable identification of fault locations within a multi-phase capacitor bank and a multi-section capacitor bank. That is, embodiments presented herein provide techniques for not only determining a location of a multiple faults in a capacitor bank across multiple phases, but also across multiple sections of the capacitor bank. For example, a fault may occur in phase A 180 of the left section 302A and a fault may occur in phase C 184 of the right section 302B. Without the techniques presented herein, identifying and locating the faults within the capacitor bank 300 may be time consuming and result in increased downtime of the capacitor bank 300.

It should be noted that the techniques for identifying and locating faults in the double WYE capacitor bank discussed with respect to FIGS. 2 and 9-14 use the unbalance current of the capacitor bank rather than the unbalance voltage as discussed with respect to the single WYE capacitor bank of FIGS. 1 and 3-8.

As shown, each of the left section 302A and the right section 302B include a number of capacitor units 186, 190, 192 and capacitors 188 for each phase (e.g., phase A 108, phase B 182, and phase C 184). That is, each section 302A, 302B is substantially similar to the other section and similar to the capacitor bank 104 discussed with respect to FIG. 3. While only two sections 302A, 302B are shown, it should be understood that the techniques presented herein may be used for any number of sections of a capacitor bank. Moreover, it should be understood that the techniques presented herein may be used to identify and locate multiple faults across any number of phases and/or any number of capacitor banks.

As discussed above, the protective device 102 may measure and use a neutral current (IN) and bus currents (IA, IB, and IC) to determine a bank unbalance current (e.g., 60KN). To measure the neutral current of the capacitor bank 300, the protective device 102 may use a current transformer 306 to measure a total neutral current between a node 304A of the left section 302A and a node 304B of the right section and ground. The current transformer 306 may be coupled to each section 302A, 302B of the capacitor bank 300. The current transformer 306 may measure and provide a total neutral current of the capacitor bank 300 to the protective device 102.

The protective device 102 may determine a compensated unbalance current by comparing the total neutral current of the capacitor bank and a positive-sequence bus current. That is, the compensated unbalance current may be a difference between the total neutral current and the positive-sequence bus current. Further, a phase angle of the compensated unbalance current may be a difference between a phase angle of the total neutral current and a phase angle of the positive-sequence bus current.

Figure 10:
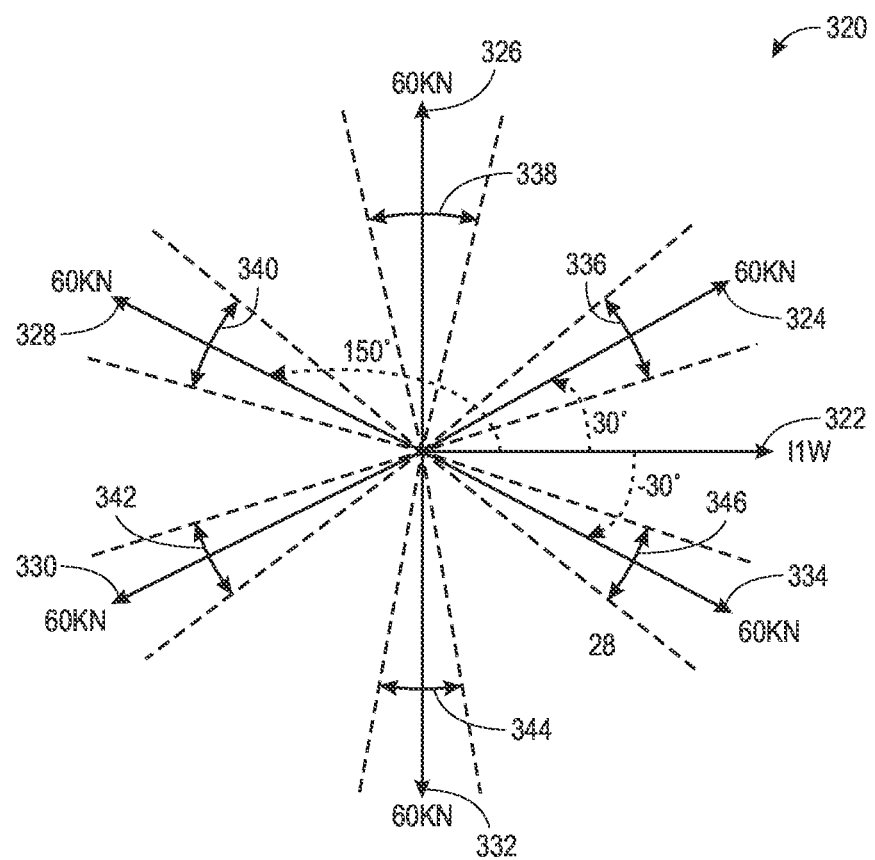
FIG. 10 is a vector representation for multi-phase faults of a double WYE capacitor bank, in accordance with an embodiment of the present disclosure.

FIG. 10 is a vector representation 320 for multi-phase faults of a double WYE capacitor bank, in accordance with an embodiment of the present disclosure. The vector representation 320 may correspond to phase angles of various measured currents of the system 150 discussed with respect to FIG. 2. The vector representation 320 is a phasor diagram and may be used to compare a phase angle of a compensated unbalance current (60KN) 324 with a phase angle of a positive-sequence bus current (I1W) 322. Similar to the compensated unbalance voltage 202 discussed with respect to FIG. 4, the compensated unbalance current (60KN) 324 may have a magnitude (and phase angle) of zero when no fault is present in the capacitor bank 104. When a fault is present in the capacitor bank 104, the compensated unbalance current 324 may have a non-zero magnitude. In that case, a phase angle of the compensated unbalance current 324 may be compared to a phase angle of the positive-sequence bus current 322 to determine a location of the fault(s) in the capacitor bank 104.

For a given combination of faults in the phases and sections of the capacitor bank 300, the phase angle of the compensated unbalance current 324 may change. That is, the phase angle of the compensated unbalance current 324 may increase or decrease for a given fault (or combination of faults) in the capacitor bank 300. To determine a location of the fault (or combination of faults) in the capacitor bank 300, the phase angle of the compensated unbalance current 324 may be compared to the phase angle of the positive-sequence bus current 322.

If the phase angle of the compensated unbalance current 324 is +30 degrees out of phase with the positive-sequence current 322, as illustrated by the phasor 324 corresponding to the compensated unbalance current, the faults may be in phase B 182 of the left section 302A and phase A 180 of the right section 302B. If the phase angle of the compensated unbalance current 324 is −120 degrees out of phase with the positive-sequence current 322, as illustrated by the phasor 334, the faults may be in phase C 184 of the left section 302A and phase A 180 of the right section 302B. If the phase angle of the compensated unbalance current 324 is +90 degrees out of phase with the positive-sequence current 322, as illustrated by the phasor 326, the faults may be in phase B 182 of the left section 302A and phase C 184 of the right section 302B. If the phase angle of the compensated unbalance current 324 is −90 degrees out of phase with the positive-sequence current 322, as illustrated by the phasor 332, the faults ay be in phase C 184 of the left section 302A and phase B 182 of the right section 302B. If the phase angle of the compensated unbalance current 324 is +150 degrees out of phase with the positive-sequence current 322, as illustrated by the phasor 328, the faults may be in phase A 180 of the left section 302A and phase C 184 of the right section 302B. If the phase angle of the compensated unbalance current 324 is −150 degrees out of phase with the positive-sequence current 322, as illustrated by the phasor 330, the faults may be in phase A 180 of the left section 302A and phase B 182 of the right section 302B.

In some embodiments, a phase angle of the compensated unbalance current 324 within about ±15 degrees of the phasors discussed above may be considered to have a phase angle of the closest phasor 324, 326, 328, 330, 332, 334. That is, the phase angle of each combination of faults may fall within a range. The ±15 degree ranges may compensate for unbalances in the capacitor bank that are not due to capacitor failures. For example, a phase angle of the compensated unbalance current 324 in a range 336 of between +15 degrees and +45 degrees may be considered to be +30 degrees out of phase with the positive-sequence current 322. A phase angle of the compensated unbalance current 324 in a range 338 between +75 degrees and +105 degrees may be considered to be +90 degrees out of phase with the positive-sequence current 322. A phase angle of the compensated unbalance current 324 in a range 340 between +135 degrees and +165 degrees may be considered to be +150 degrees out of phase with the positive-sequence current 322.

A phase angle of the compensated unbalance current 324 in a range 342 between 435 degrees and 465 degrees may be considered to be 450 degrees out of phase with the positive-sequence current 322. A phase angle of the compensated unbalance current 324 in a range 344 between 405 degrees and −75 degrees may be considered to be −90 degrees out of phase with the positive-sequence current 322. A phase angle of the compensated unbalance current 324 in a range 346 between −45 degrees and 45 degrees may be considered to be −30 degrees out of phase with the positive-sequence current 322.

Advantageously, using the phase angle of the compensated unbalance current 324, 326, 328, 330, 332, 334 relative to the phase angle of the positive-sequence current 322 (or a difference between the phase angle of the compensated unbalance current 324, 326, 8, 330, 332, 334 and the phase angle of the positive-sequence current 322) enables determining a location of multiple faults in multiple phases and multiple sections of a multi-phase double WYE capacitor bank. In this way, techniques presented herein enable determining a fault location relatively quickly and substantially reduce an inspection time to locate the actual fault (e.g., a faulty capacitor and or faulty capacitor unit) across multiple phases and multiple sections.

Figure 11:
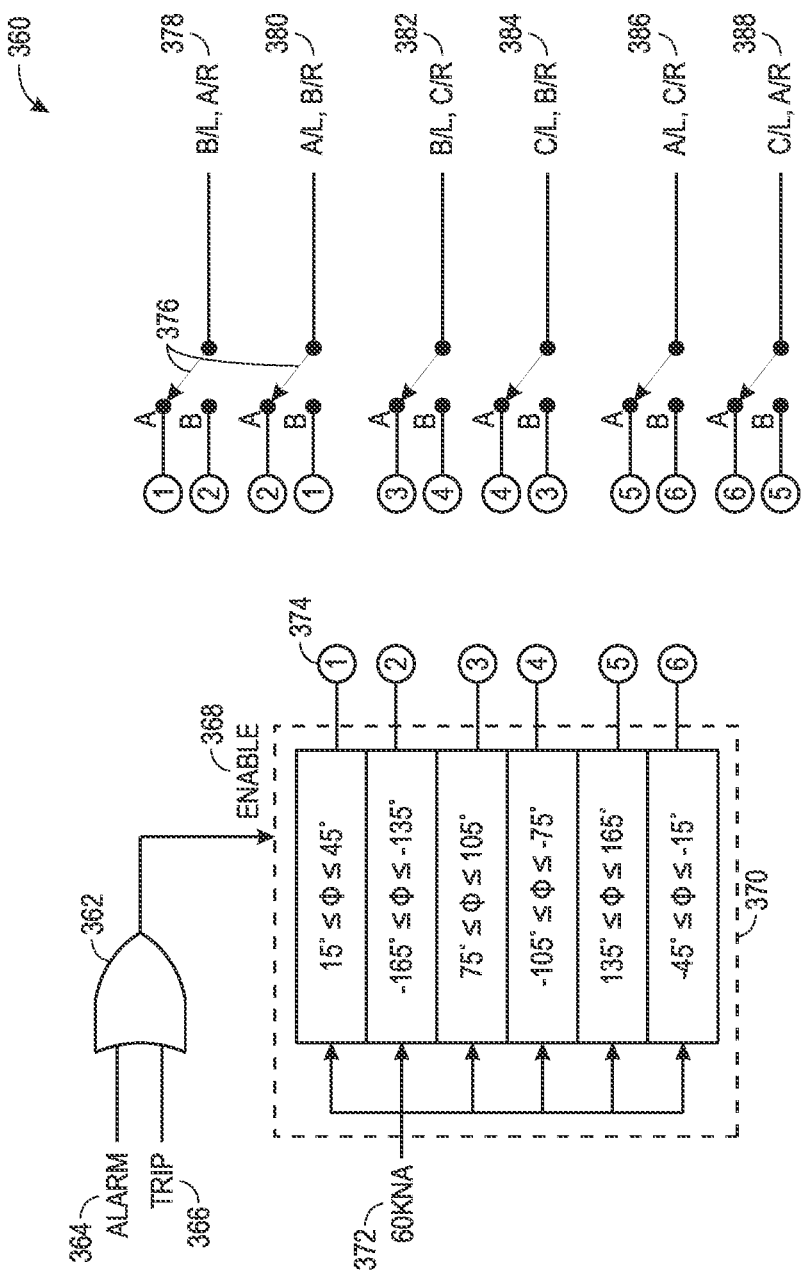
FIG. 11 is a logic diagram for determining a location of faults an ungrounded multi-phase double WYE capacitor bank, in accordance with an embodiment of the present disclosure.

FIG. 11 is a logic diagram illustrating logic 360 for determining a location of faults in an ungrounded multi-phase double WYE capacitor bank, in accordance with an embodiment of the present disclosure. In embodiments, the logic 220 may be part of the protective device 152 discussed with respect to FIG. 2. In other embodiments, the logic 360 may be separate from the protective device 152 and may receive current and/or current phase angles measured by the protective device 152.

As shown, the logic 360 includes a logic controller 370. The logic controller 370 may receive an ENABLE signal 368 indicating that an ALARM signal 364 or a TRIP signal 366 has occurred. The ALARM signal 364 and the TRIP signal 366 may indicate an issue within a corresponding capacitor bank, such as the capacitor banks 154A 154B, 302A, 302B, discussed with respect to FIGS. 2 and 9. For example, the ALARM signal 364 or the TRIP signal 366 may indicate an overvoltage caused by, for example, a short circuit in the capacitor bank, a blown fuse, an over temperature of one or more capacitors in the capacitor bank, and the like.

In some embodiments, the ALARM signal 364 and the TRIP signal 366 may be received by a logic OR gate 362. Based on the values of the ALARM signal 364 and the TRIP signal 366, the logic OR gate 362 may provide the ENABLE signal 368 as a logic high (e.g., 1) to the logic controller 370. That is, if an issue in the capacitor bank is indicated by either the ALARM signal 364 or the TRIP signal 366 being a logic high (e.g., 1), the ENABLE signal 368 may be a logic high and enable the logic controller 370 to evaluate a phase angle 372 of the compensated unbalance current of the capacitor bank.

The logic 360 may identify one or more phase angle ranges corresponding to multi-phase and multi-section faults within the capacitor bank. For example, as shown, the logic 360 may identify the phase angle ranges of +30 degrees±15 degrees (e.g., from +15 degrees to +45 degrees), −150 degrees±15 degrees (e.g., from −165 degrees to −135 degrees), +90 degrees±15 degrees (e.g., from +75 degrees to +105 degrees), −90 degrees±15 degrees (e.g., from −105 degrees to −75 degrees), +150 degrees±15 degrees (e.g., from +135 degrees to +165 degrees), and −30 degrees±15 degrees (e.g., from −45 degrees to −15 degrees), inclusive. The logic controller 370 may receive the phase angle 372 of the compensated unbalance current from the protective device 152 and determine a phase angle range within which the phase angle 372 falls. The logic controller 370 may output a logic high value (e.g., 1) on a corresponding line 374 based on a phase angle range corresponding to the phase angle 372.

The logic 360 may provide an output 378, 380, 382, 384, 386, 388 indicating locations of the faults in the capacitor bank. The output may be provided to various switches 376. A position of the switches 376 may depend on whether the corresponding capacitor bank is fused or fuseless. The switches 376 may be in position 'A' if the corresponding capacitor bank is fused. The switches 376 may be in position 'B' if the corresponding capacitor bank is fuseless. That is, the various phase angle ranges of the logic controller 370 may correspond to different fault locations based on whether the capacitor bank is fused or fuseless. For example, the logic controller may indicate that faults are located in phase B 182 of the left section 302A and phase A 180 of the right section 302B if the phase angle 372 is within the range of +15 degrees to +45 degrees for a fused capacitor bank, as indicated by the output 378. However, the same phase angle 372 may indicate the faults are located in phase A 180 of the left section 302A and phase B of the right section for a fuseless capacitor bank, as indicated by the output 380.

The logic 360 may enable the protective device 152 to quickly analyze the phase angle 372 of the compensated unbalance current of the capacitor bank and identify a location (e.g., the phase and section) of the faults therein. In this way, the logic 360 may substantially reduce a downtime needed to inspect the capacitor bank and locate the faults. In some embodiments, the output 378, 380, 382, 384, 386, 388 of the logic 360 may be used to enable an alarm or notification indicating that an issue has occurred within the corresponding capacitor bank and the locations (e.g., the phase and section) where the issues are located in the capacitor bank. An operator may use the alert or notification to quickly resolve the issue and resume operation of the capacitor bank.

Figure 12:
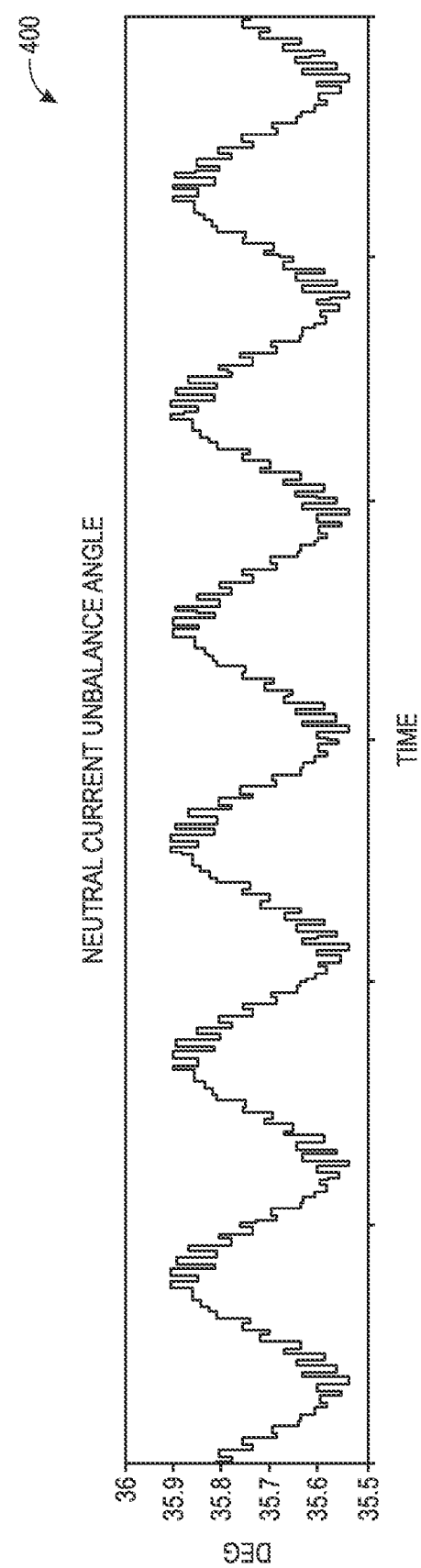
FIG. 12 is a graph illustrating a current phase angle of a fused double WYE capacitor bank with a fault in a left side of phase B and a right side of phase A, in accordance with an embodiment of the present disclosure.

FIG. 12 is a graph 400 illustrating a current phase angle of a fused double WYE capacitor bank with a fault in a left side 302A of phase B 182 and a right side 302B of phase A 180, in accordance with an embodiment of the present disclosure. The current phase angle in the graph 400 corresponds to a phase angle of a compensated unbalance current of a capacitor bank (or a difference between the phase angle of the compensated unbalance current and the phase angle of the positive-sequence current of the capacitor bank), as discussed above. As shown, the current phase angle in the graph 400 is between about +35.9 degrees and +35.5 degrees, ±15 degrees. Thus, the current phase angle is within the phase angle range of +30 degrees±15 degrees (e.g., from +15 degrees to +45 degrees), indicating faulted capacitors and/or capacitor units in the left side 302A of phase B 182 and the right side 302B of phase A 180 (e.g., the output 378 of FIG. 5) of the capacitor bank.

Figure 13:
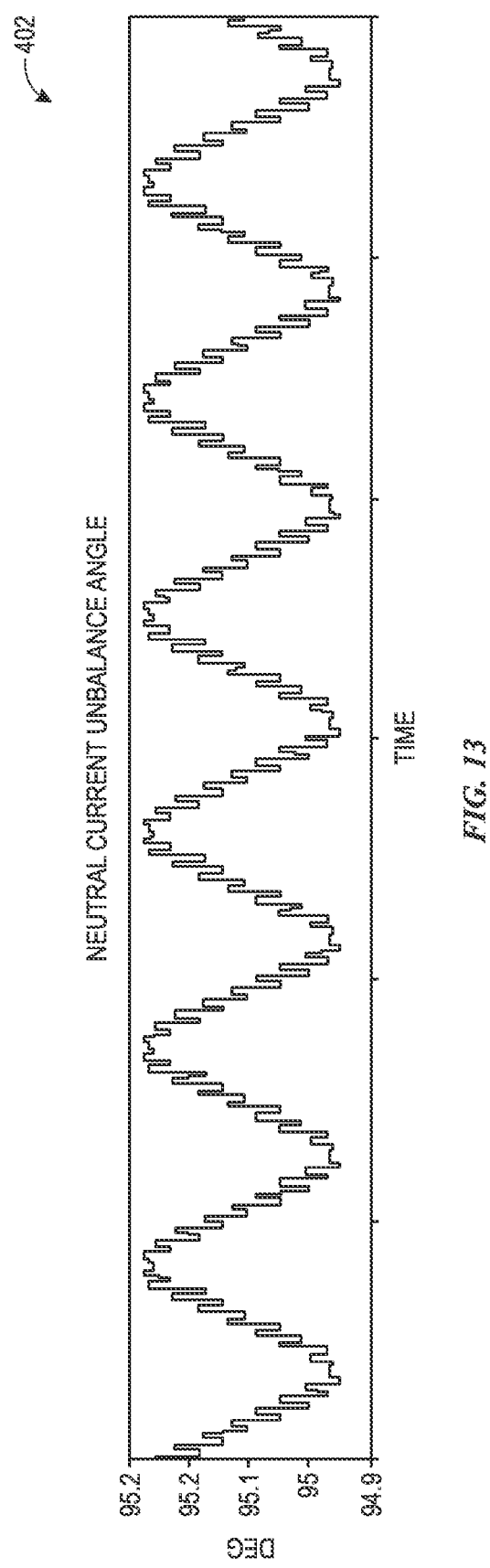
FIG. 13 is a graph illustrating a current phase angle of a fused double WYE capacitor bank with a fault in a left side of phase B and a right side of phase C, in accordance with an embodiment of the present disclosure.

FIG. 13 is a graph 402 illustrating a current phase angle of a fused double WYE capacitor bank with a fault in a left side 302A of phase B 182 and a right side 302B of phase C 184, in accordance with an embodiment of the present disclosure. As above, the current angle in the graph 402 corresponds to a phase angle of the compensated unbalance current of a capacitor bank (or a difference between the phase angle of the compensated unbalance current and the phase angle of the positive-sequence current of the capacitor bank). As shown, the current phase angle in the graph 400 is between about +95.2 degrees and +94.9 degrees, ±15 degrees. Thus, the current phase angle is within the phase angle range of +90 degrees±15 degrees (e.g., from +75 degrees to ±105 degrees), indicating faulted capacitors and/or capacitor units in the left side 302A of phase B 182 and the right side 302B of phase C 184 (e.g., the output 382 of FIG. 5) of the capacitor bank.

Figure 14:
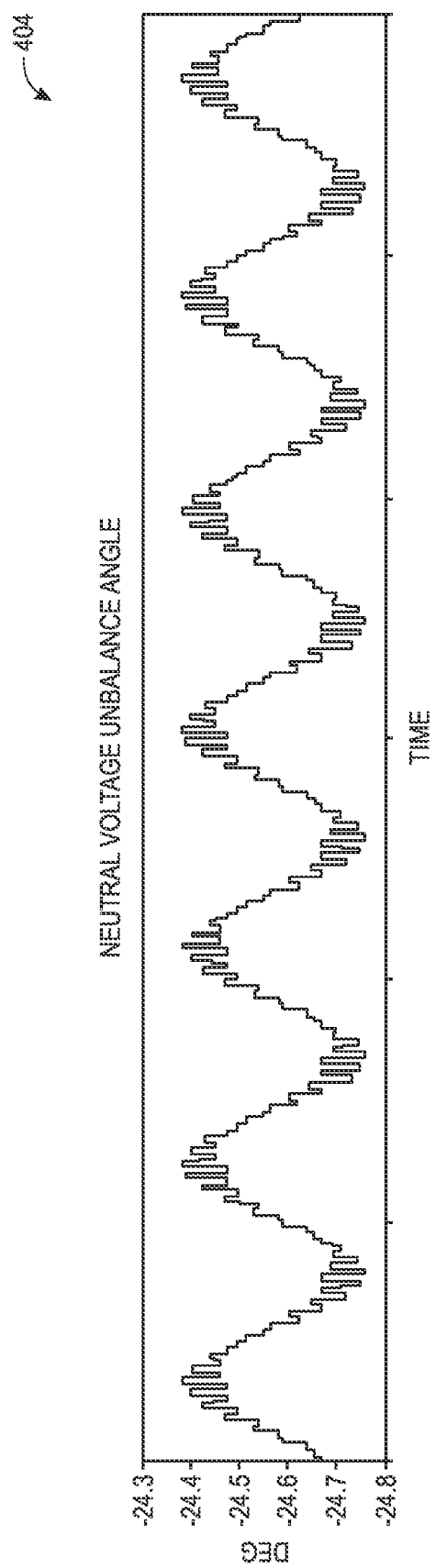
FIG. 14 is a graph illustrating a current phase angle of a fused double WYE capacitor bank with a fault in a left side of phase C and a right side of phase A, in accordance with an embodiment of the present disclosure.

FIG. 14 is a graph 404 illustrating a current phase angle of a fused double WYE capacitor bank with a fault in a left side 302A of phase C 184 and a right side 302B of phase A 180, in accordance with an embodiment of the present disclosure. As above, the current angle in the graph 402 corresponds to a phase angle of the compensated unbalance current of a capacitor bank (or a difference between the phase angle of the compensated unbalance current and the phase angle of the positive-sequence current of the capacitor bank). As shown, the current phase angle in the graph 404 is between about −24.4 degrees and +−24.8 degrees, ±15 degrees. Thus, the current phase angle is within the phase angle range of −30 degrees±15 degrees (e.g. from −45 degrees to −15 degrees), indicating faulted capacitors and/or capacitor units in the left side 302A of phase C 184 and the right side 302B of phase A 180 (e.g., the output 388 of FIG. 5) of the capacitor bank.

Figure 15:
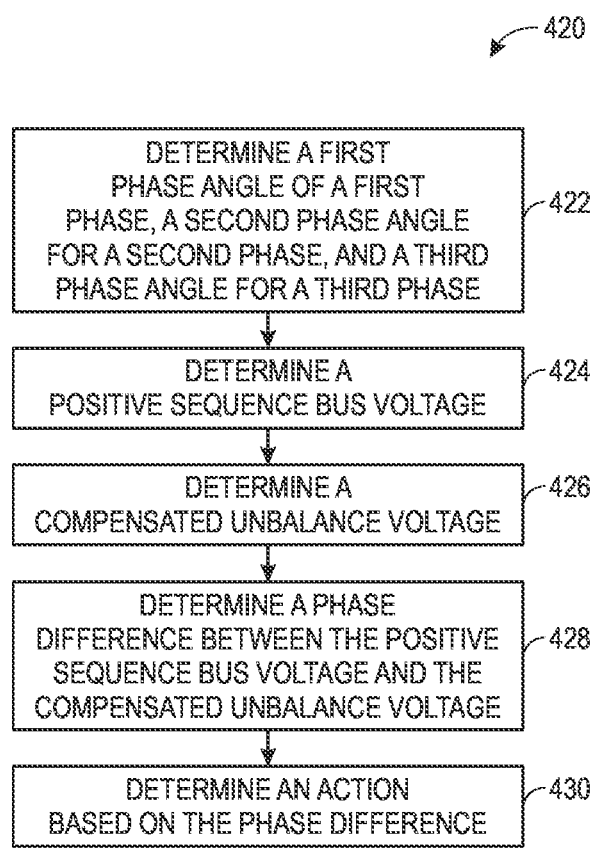
FIG. 15 is a flowchart of a process for determining a location of a fault in a multi-phase capacitor bank, in accordance with an embodiment of the present disclosure.

FIG. 15 is a flowchart of a process 420 for determining a location of a fault in a multi-phase capacitor bank, in accordance with an embodiment of the present disclosure. While the process 420 relates to determining one or more fault locations based on a voltage phase angle, it should be understood that similar techniques may be used to determine one or more fault locations based on a current phase angle.

As shown, the process 420 begins at operation 422 where a first phase angle of a first phase is determined, a second phase angle of a second phase is determined, and a third phase angle of a third phase is determined. As discussed above, the first phase, second phase, and third phase may correspond to various voltages of various phases (e.g., A, B, and C) of a capacitor bank and may be measured by a power transformer, such as the power transformer 196 discussed with respect to FIG. 3

At operation 424, a positive-sequence bus voltage is determined. The positive-sequence bus voltage may be determined based on may be determined based on the phase angles determined in operation 422. That is, the positive-sequence bus voltage may be based on the first phase angle, the second phase angle, and the third phase angle. At operation 426, a compensated unbalance voltage is determined. The compensated unbalance voltage may account for an inherent unbalance in the capacitor bank.

At operation 428, a phase difference between a phase angle of the positive-sequence bus voltage determined at operation 424 and a phase angle of the compensated unbalance voltage determined at operation 426 is determined. The phase difference may indicate an unbalance voltage phase angle of the corresponding capacitor bank. At operation 430, an action is determined based on the phase difference. For example, an alert or notification may be generated to indicate one or more faults within the capacitor bank.

Advantageously, the process 420 may enable determining locations of multiple faults across multiple phases of a capacitor bank. In this way, the process 420 may substantially reduce an inspection time to locate the faults and reduce a downtime of the capacitor bank to resolve the detected issues.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method comprising:
   measuring a current or voltage signal associated with a multi-phase capacitor bank;
   determining a compensated unbalance signal for the capacitor bank based at least in part on the current or voltage signal, wherein the compensated unbalance signal takes into account an inherent voltage or current unbalance in the capacitor bank;
   determining a first phase angle of the compensated unbalance signal;
   determining a second phase angle of a positive-sequence signal of the capacitor bank; and
   comparing the first phase angle and the second phase angle to identify a first faulted capacitor in a first phase of the capacitor bank and a second faulted capacitor in a second phase of the capacitor bank.

2. The method of claim 1, comprising generating an alert signal based at least in part on the first phase of the first faulted capacitor and the second phase of the second faulted capacitor.

3. The method of claim 1, wherein the capacitor bank comprises more than one section.

4. The method of claim 1, wherein the second phase angle is a fixed phase angle for the capacitor bank.

5. The method of claim 1, wherein the second phase angle is determined from the current or voltage signal.

6. The method of claim 1, wherein the capacitor bank is fused.

7. The method of claim 6, wherein the positive-sequence signal compensates for the capacitor bank being fused.

8. The method of claim 1, wherein the capacitor bank is fuseless or unfused.

9. A non-transitory computer readable medium storing instructions that, when executed by a processor of a protective device of a multi-phase electric power delivery system, cause the processor to:
calculate a positive-sequence current using current signals obtained from a capacitor bank;
calculate an unbalance current using a neutral current and one or more bus currents obtained from the capacitor bank, wherein the unbalance current takes into account an inherent current unbalance in the capacitor bank;
calculate an unbalance current phase angle as an angle between a phase angle of the unbalance current and a phase angle of the positive-sequence current; and
determine a location of at least a first fault and a second fault in the capacitor bank based at least in part on the unbalance current phase angle, wherein the location of the first fault and the second fault includes a phase and a section of the capacitor bank.

10. The computer readable medium of claim 9, wherein the location of the first fault and the location of the second fault is determined by comparing the unbalance current phase angle to a plurality of fault identification ranges.

11. The computer readable medium of claim 10, wherein each fault identification range of the plurality of fault identification ranges is associated with a phase of the capacitor bank and a section of the capacitor bank.

12. The computer readable medium of claim 11, wherein the first fault and the second fault are located in different phases of the capacitor bank and different sections of the capacitor bank, wherein the locations of the first fault and the second fault are associated with a fault identification range of the plurality of fault identification ranges in which the unbalance current phase angle falls.

13. The computer readable medium of claim 11, wherein the bus currents comprise a current for each phase of the multi-phase electric power delivery system measured between a bus corresponding to each phase and ground.

14. The computer readable medium of claim 11, wherein the location of the first fault is in a first phase of the capacitor bank and the location of the second fault is in a second phase of the capacitor bank, and wherein the first phase and the second phase are different.

15. The computer readable medium of claim 11, wherein the location of the first fault is in a first section of the capacitor bank and the location of the second fault is in a second section of the capacitor bank, and wherein the first section and the second section are different.

16. A system, comprising:
a capacitor bank comprising a plurality of capacitors;
a busbar;
a protective device coupled to the capacitor bank and the busbar, the protective device configured to:
calculate a positive-sequence voltage using voltage signals obtained from the capacitor bank;
calculate an unbalance voltage using voltage signals obtained from a neutral point of the capacitor bank and a zero-sequence voltage measured at the busbar, wherein the unbalance voltage takes into account an inherent voltage in the capacitor bank;
determine an unbalance voltage phase angle using a phase angle of the unbalance voltage and a phase angle of the positive-sequence voltage; and
determine a location of at least a first fault and a second fault in the capacitor bank based at least in part on the unbalance voltage phase angle, wherein the location of the first fault includes a first phase and the location of the second fault includes a second phase different than the first phase.

17. The system of claim 16, wherein the locations of the first fault and the second fault are determined by comparing the unbalance voltage phase angle to a plurality of fault identification ranges.

18. The system of claim 17, wherein each fault identification range of the plurality of fault identification ranges is associated with a phase of the capacitor bank.

19. The system of claim 16, wherein the unbalance voltage phase angle is a difference between the phase angle of the unbalance voltage and the phase angle of the positive-sequence voltage.

* * * * *